United States Patent [19]

Null et al.

[11] Patent Number: 4,501,979
[45] Date of Patent: Feb. 26, 1985

[54] CURRENT AMPLIFIER HAVING MULTIPLE SELECTABLE OUTPUTS

[75] Inventors: Michael W. Null; Robert N. Dotson, both of Mesa; Robert B. Davis, Tempe, all of Ariz.

[73] Assignee: Motorola, Inc., Schaumburg, Ill.

[21] Appl. No.: 413,054

[22] Filed: Aug. 30, 1982

[51] Int. Cl.³ .................... H03K 17/62; H03F 3/04
[52] U.S. Cl. .................... 307/494; 307/270; 307/297; 307/467; 307/491; 328/172; 330/288
[58] Field of Search ............ 307/443, 454, 455, 467, 307/491, 493, 494, 254, 270, 297, 300, 315; 328/172; 330/288, 296

[56] References Cited

U.S. PATENT DOCUMENTS

| 3,577,167 | 5/1971 | Avins | 330/296 X |
| 3,723,761 | 3/1973 | Masaki | 307/443 X |
| 4,057,763 | 11/1977 | Wheatley, Jr. | 330/288 |
| 4,417,240 | 11/1983 | Ahmed | 307/270 X |

Primary Examiner—Stanley D. Miller
Assistant Examiner—David R. Hudspeth
Attorney, Agent, or Firm—William E. Koch

[57] ABSTRACT

A current amplifier is provided having a single control amplifier and a plurality of output stages. The desired output stage is digitally selected. The ratios of the output stage currents may be selected during the metalization process. A single capacitor compensates for all output stages regardless of which output stage is selected.

5 Claims, 1 Drawing Figure

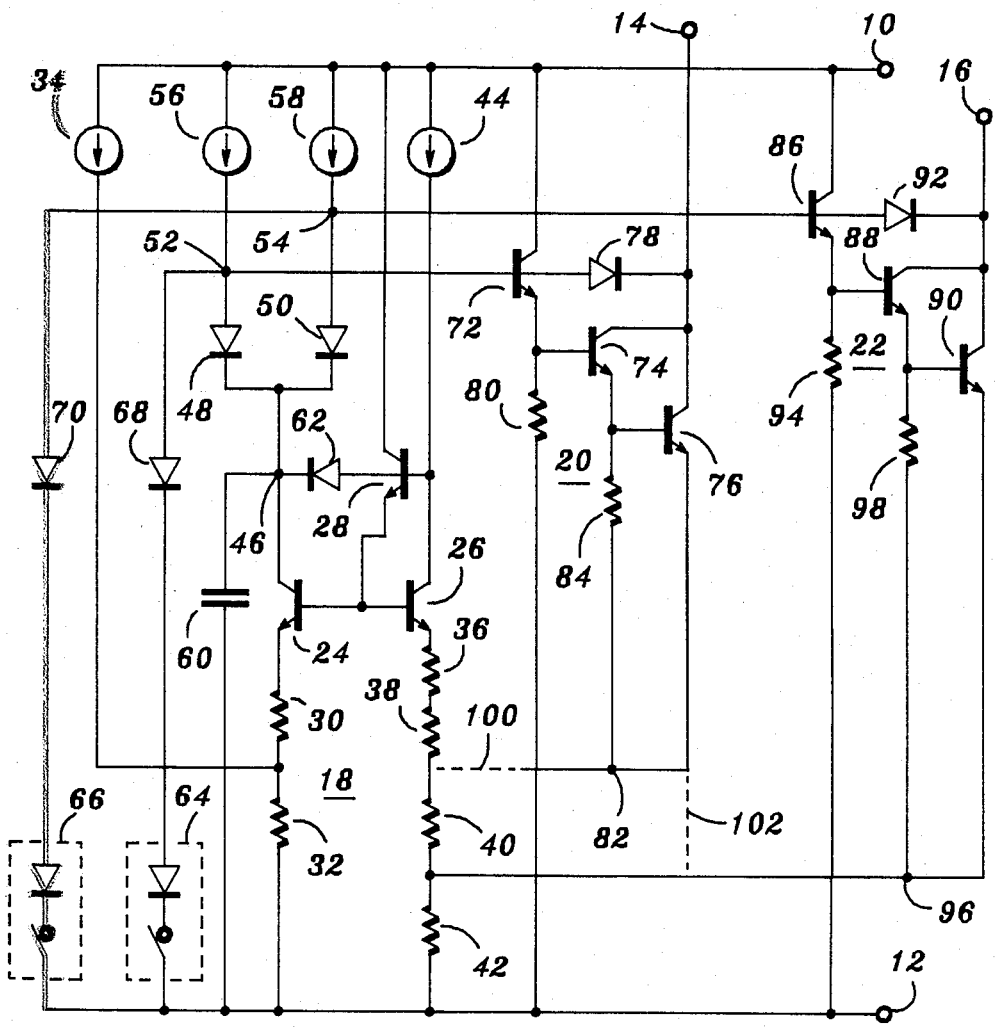

4,501,979

CURRENT AMPLIFIER HAVING MULTIPLE SELECTABLE OUTPUTS

BACKGROUND OF THE INVENTION

1. Field of the Invention

This invention relates, in general, to a current amplifier and more specifically to a current amplifier having a single control amplifier wherein logic selects one of a plurality of output stages.

2. Background Art

Current amplifiers typically have a control amplifier with a first current supplied by a current source and a second current that is multiplied due to the resistance values in the control amplifier.

In order to produce different output currents, one known configuration provides separate control amplifiers and output stages for each output current desired. However, this configuration requires a relatively large amount of area when placed on an integrated circuit chip and therefore increases the cost proportionally. Furthermore, the outputs cannot be varied once the mask of the chip is manufactured and an output compensation capacitor is required for each output stage.

Another known configuration changes a reference current to provide different outputs. However, this requires additional circuitry to change the reference current and does so with PNP transistors which slows the response time drastically.

Thus, what is needed is a current amplifier wherein one output current is digitally selected from more than one current, the ratio of outputs available may be varied during metalization of the chip, and the outputs may be compensated by a single capacitor.

SUMMARY OF THE INVENTION

Accordingly, it is an object of the present invention to provide an improved current amplifier.

Another object of this invention is to provide a current amplifier wherein one output current may be digitally selected from more than one output.

A further object of this invention is to provide a current amplifier having a selectable output current wherein the output currents ratio may be varied subsequent to masking.

Yet another object of this invention is to provide a current amplifier wherein a single capacitor compensates a control amplifier having selectable output currents.

In carrying out the above and other objects of the invention in one form, there is provided an improved current amplifier having a first and second voltage terminal. A plurality of output means is coupled to both voltage terminals, wherein one of the output means is digitally selected to provide an output current at an output terminal. A current means is coupled to both of the voltage terminals and the plurality of output means for providing a current to the selected output means.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the invention.

DETAILED DESCRIPTION OF THE INVENTION

Referring now to the single FIGURE, the current amplifier shown includes a $V_{CC}$ terminal 10, a ground terminal 12, a first output terminal 14 and a second output terminal 16. Alternatively, the terminal 12 may be at a potential other than ground as long as the voltage is sufficiently below that of $V_{CC}$ terminal 10 when using NPN transistors.

The current amplifier shown further includes a control amplifier 18 and a first and a second output stage 20 and 22, respectively. The number of output stages 20 and 22 and output terminals 14 and 16 is not to be limited by the drawing, but may actually be a plurality of output stages and terminals. Alternatively, the output terminals 14 and 16 may be joined as one.

The control amplifier 18 includes a first NPN transistor 24 having its base coupled to a second NPN transistor 26 and to the emitter of beta eliminator transistor 28. Transistor 24 has its emitter coupled to ground terminal 12 by series connected degeneration resistor 30 and resistor 32. The common terminals of resistor 30 and resistor 32 are coupled to $V_{CC}$ terminal 10 by current source 34. Transistor 26 has its emitter coupled to ground terminal 12 by series connected resistors 36, 38, 40, and 42. Resistors 32, 38, 40 and 42 may be of any type, but in the preferred embodiment are interdigitized n+ resistors, thereby providing a match of thermal and stress gradients. The collector of transistor 26 is connected to the base of transistor 28 and coupled by current source 44 to $V_{CC}$ terminal 10. The collector of transistor 28 is connected to $V_{CC}$ terminal 10. The collector of transistor 24 is connected to node 46. Node 46 is connected to the cathodes of diodes 48 and 50. The anodes of diodes 48 and 50 are connected to nodes 52 and 54, respectively. Nodes 52 and 54 are coupled to $V_{CC}$ terminal 10 by current sources 56 and 58, respectively. Node 46 is also coupled to ground terminal 12 by capacitor 60 and connected to the cathode of diode 62. Capacitor 60 limits the rise time and establishes loop stability of the control amplifier 18 that would otherwise be determined by parasitic capacitance. The location of capacitor 60 eliminates the need for more than one capacitor to compensate for each output stage. Capacitor 60 may alternatively be connected between node 46 and $V_{CC}$ terminal 10. The anode of diode 62 is connected to the base of transistor 28. Diode 62 may alternatively be a second emitter from transistor 28 and prevents saturation of transistor 24 when nodes 52 and 54 are low. Anti-saturation diode 62 is not required to be included in the circuit when nodes 52 and 54 remain sufficiently high so that the current mirror comprising transistors 24 and 26 will not saturate. Node 52 is coupled to output terminal 14 by output stage 20 and is activated by diode switch 64. Node 54 is coupled to output terminal 16 by output stage 22 and is activated by diode switch 66.

Node 52 is connected to the anode of diode 68 and node 54 is connected to the anode of diode 70. The cathodes of diodes 68 and 70 are coupled to ground terminals 12 by diode switches 64 and 66, respectively. The circuitry of diode switches 64 and 66 are understood by those skilled in the art to include an open collector transistor, but are schematically represented by the standard series diode—switch representation. Each diode switch 64 and 66 has an input terminal for receiving a digital signal. These digital signals, by controlling the state of the nodes 52 and 54, determine which output stage 20 or 22 provides an output current.

Output stage 20 comprises triple Darlington transistors 72, 74 and 76. The collector of transistor 72 is connected to $V_{CC}$ terminal 10. The collectors of transistors 74 and 76 are connected to output terminal 14. The base of transistor 72 is connected to node 52 and to the anode of diode 78. The cathode of diode 78 is connected to output terminal 14. Diode 78 functions as an anti-saturation clamp for the Darlington transistors 74 and 76. When the collector voltage of transistor 74 approaches its base voltage, diode 78 steals base current from transistor 72, thereby holding transistors 74 and 76 above saturation. The emitter of transistor 72 is connected to the base of transistor 74 and is coupled to ground terminal 12 by resistor 80. The emitter of transistor 74 is connected to the base of transistor 76 and coupled to node 82 by resistor 84. The emitter of transistor 76 is connected to node 82. Alternatively, transistor 88, and transistor 74 of output stages 22 and 20, respectively may have their collectors connected to $V_{CC}$ terminal 10 and their emitters coupled to ground terminal 12 by resistors 98 and 84, respectively.

Output stage 22 is similar to output stage 20 and comprises triple Darlington transistors 86, 88, and 90. The collector of transistor 86 is connected to $V_{CC}$ terminal 10. The collectors of transistors 88 and 90 are connected to output terminal 16. The base of transistor 86 is connected to node 54 and to the anode of diode 92. The cathode of diode 92 is connected to output terminal 16. The output stages 20 and 22 will operate satisfactorily without diodes 78 and 92 if the collector voltage at transistor 76 or 90 remains high enough to prevent saturation. The emitter of transistor 86 is connected to the base of transistor 88 and is coupled to ground terminal 12 by resistor 94. The emitter of transistor 88 is connected to the base of transistor 90 and is coupled to node 96 by resistor 98. The emitter of transistor 90 is connected to node 96. Resistors 80, 84, 94, and 98 enhance the speed of the circuit. They are not required and may alternatively be current sources or be removed from the circuit altogether.

Two output stages 20 and 22 are shown, however, any number of output stages may be included in the circuit. Each output stage requires a respective current source, coupling diode, and diode switch. For example, output stage 20 is controlled by current source 56, diode 48 and diode switch 64.

Node 82 may be connected either to the common terminal of series connected resistors 38 and 40 or to node 96 which is connected to the common terminals of series connected resistors 40 and 42. This alternative connection is shown by dotted lines 100 and 102 and may be accomplished, for example, during the metalization of the integrated circuit; thereby, allowing for the mass production of an integrated circuit with a choice of output circuits being deferred until the metalization stage according to customer choice. Yet another embodiment may have resistors 40 and 42 as a single resistor that may be tapped at a plurality of locations, thereby providing for a number of resistance ratios.

In operation, the control amplifier 18 sets the voltage drop across resistor 32 to equal the voltage at node 82 or 96, depending on which output stage is selected. The current to resistor 42 is supplied from current source 44 and transistors 74 and 76 or 88 and 90, depending on which output is selected. The current to resistor 32 is supplied from current source 34 and current source 56 or 58. The majority of current to resistor 42 flows through the emitter of transistor 76 or 90 by balancing current fed back through the base of transistor 72 or 86. The value of resistor 38 is chosen such that the sum of the voltage drops across resistors 38, 40, and 42 due to current source 44 is equal to the voltage drop across resistor 32 due to either current source 56 or 58. Resistors 30 and 36 reduce the gain of control amplifier 18 in order to increase loop stability.

When diode switch 66 is open, node 54 is high, and a 3 $V_{be}$ or greater drop appears at node 54. When diode switch 66 turns on causing node 54 to go low, its transistor collector will be clamped at 1 $V_{be}$, and along with diode 70, will clamp node 54 at 2 $V_{be}$, effectively shutting off the output stage.

Although the invention has been illustrated as having certain types of transistors, it will be understood that other types of transistors or semiconductor devices can be substituted to achieve the advantages of the present invention.

By now it should be appreciated that there has been provided an improved current amplifier. This current amplifier provides for the digital selection of one of a plurality of output stages in combination with a single control amplifier. The configuration allows for a single capacitor that compensates the control amplifier for all output stages. Furthermore, the ratio of output currents from the output stages may be varied during metalization of the integrated circuit.

We claim:

1. A current amplifier having a first and a second voltage terminal, comprising:
   plurality of output means coupled between said first and said second voltage terminals;
   current means couped between said first and said second voltage terminals and coupled to said plurality of output means for providing a predetermined current to said output terminal, said current means comprising:
   a first transistor coupled to a plurality of nodes; and
   a plurality of current sources, one each of said plurality of current sources coupled between said first voltage terminal and one each of said plurality of nodes, one each of said nodes coupled to one each of said plurality of output means; and
   plurality of selection means, each of said plurality of selection means coupled to a respective one of said plurality of output means, each one of said plurality of selection means receiving one of a plurality of digital input signals for selecting at least one of said output means.

2. The current amplifier according to claim 1 wherein said current means further includes:
   a second transistor having a base coupled to a base of said first transistor, and a collector of said second transistor coupled to said first voltage terminal; and
   resistance means coupled between an emitter of said second transistor and said second voltage terminal, and coupled to said plurality of output means for providing selectable resistance values between each of said plurality of output means and said second voltage terminal, said first transistor having its collector-emitter current path coupled to said plurality of nodes.

3. The current amplifier according to claims 1 or 2 further comprising a capacitor coupled between said collector of said first transistor and one of said first and said second voltage terminals.

4. The current amplifier according to claim 2 wherein said current means further includes:
- a third transistor having a base coupled to said collector of said second transistor, a collector coupled to said first voltage terminal, and an emitter coupled to said bases of both of said first and said second transistors;
- a diode having an anode coupled to said base of said third transistor and a cathode coupled to said collector of said first transistor.

5. A current amplifier having a first and a second voltage terminal, a plurality of output selection terminals, and at least one output terminal, comprising:
- a first transistor having a collector coupled to a first node and a second node;
- a first current source coupled between said first node and said first voltage terminal;
- a second current source coupled between said second node and said first voltage terminal;
- a first resistor having a first terminal coupled to an emitter of said first transistor;
- a second resistor having a first terminal coupled to a second terminal of said first resistor and to said first voltage terminal by a third current source, and a second terminal coupled to said second voltage terminal;
- a capacitor coupled between said collector of said first transistor and one of said first and said second voltage terminals;
- a second transistor having a base coupled to said base of said first transistor, and a collector coupled to said first voltage terminal by a fourth current source;
- a third transistor having an emitter coupled to the bases of said first and second transistors, a base coupled to said collectors of said first transistor and said second transistor, and a collector coupled to said first voltage terminal;
- resistive means coupled between said emitter of said second transistor and said second voltage terminal;
- a plurality of output stages, wherein each of said output stages is coupled to one of said nodes, said first voltage terminal, said second voltage terminal, and said resistive means, said resistive means having a selective resistance for each of said output stages; and
- digital switching means coupled to each of said plurality of nodes for selecting a desired output stage.

* * * * *